United States Patent [19]
Lloyd et al.

[11] Patent Number: 5,598,757
[45] Date of Patent: Feb. 4, 1997

[54] METHOD FOR SHEARING PANELS

[75] Inventors: James L. Lloyd, Ringoes; Edward M. Olbrick, Ewing, both of N.J.; Ivan Pawlenko, Holland, Pa.; Russell E. Schuss, Cranbury; Girard Sidone, Hamilton Township, Mercer County, both of N.J.

[73] Assignee: Lucent Technologies Inc., Murray Hill, N.J.

[21] Appl. No.: 382,698

[22] Filed: Feb. 2, 1995

[51] Int. Cl.$^6$ ........................................... H05K 3/02
[52] U.S. Cl. .................. 83/23; 83/468.6; 83/268; 83/282; 83/929.1; 83/446; 29/846
[58] Field of Search ................ 83/13, 23, 468.5, 83/468.6, 468.7, 209, 268, 282, 364, 929.1, 155, 446, 418, 435.1, 437; 29/846, 848, 851

[56] References Cited

U.S. PATENT DOCUMENTS

| | | | |
|---|---|---|---|
| 2,657,601 | 11/1953 | Bentley | 83/446 |
| 3,922,937 | 12/1975 | Maddox | 83/282 |
| 4,648,298 | 3/1987 | Sutton | 83/62 |
| 4,679,473 | 7/1987 | Hirata et al. | 83/468.7 |
| 4,747,330 | 5/1988 | Carithers, Jr. | 83/468.7 |
| 4,830,554 | 5/1989 | Lopez | 83/929.1 |
| 5,435,218 | 7/1995 | Martin | 83/468.6 |
| 5,467,677 | 11/1995 | Kinson, Jr. | 83/934 |

OTHER PUBLICATIONS

Sales literature (undated) from NEFF Press, disclosing a frame-mounted hydraulic press.

*Primary Examiner*—Rinaldi I. Rada
*Assistant Examiner*—Allan M. Schrock
*Attorney, Agent, or Firm*—Robert B. Levy

[57] ABSTRACT

A tab (22) at the edge of a panel (10) may be advantageously sheared by transporting the panel into an in-line shear (30). As the panel is transported into the shear, an adjustable rail (52) engages the tab (22) to guide the panel to maintain its orientation. The rail (52) is adjusted after the tab (22) has been sheared to now engage the panel (10) along its edge formed by the removal of the tab. In this way, the rail (52) can guide the panel upon transport from the shear.

6 Claims, 4 Drawing Sheets

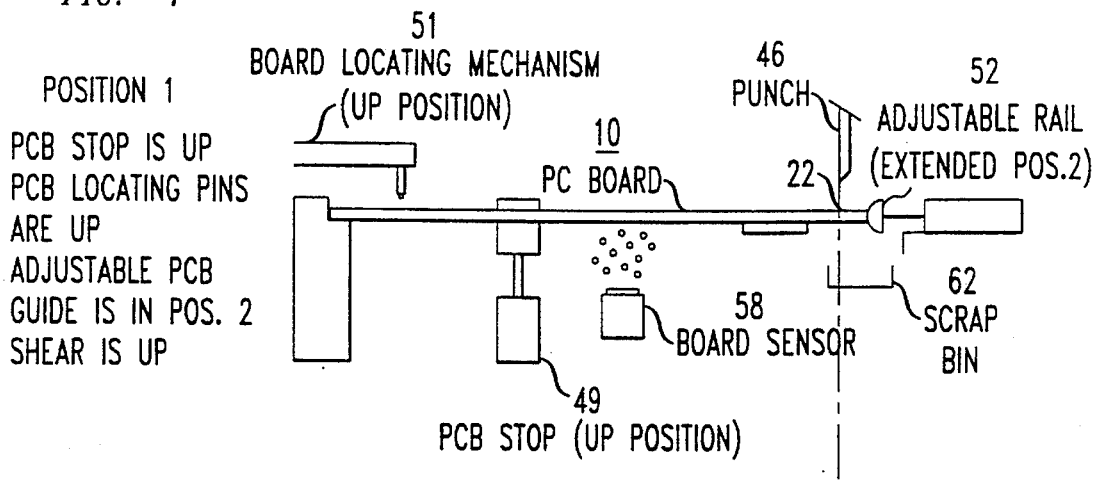
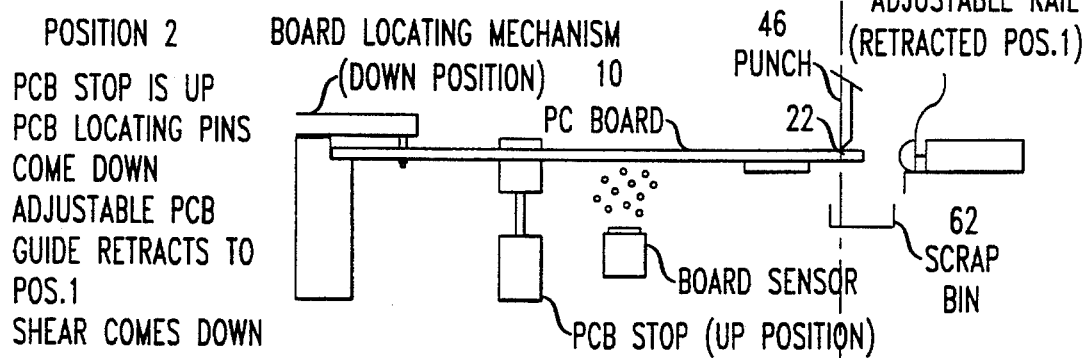
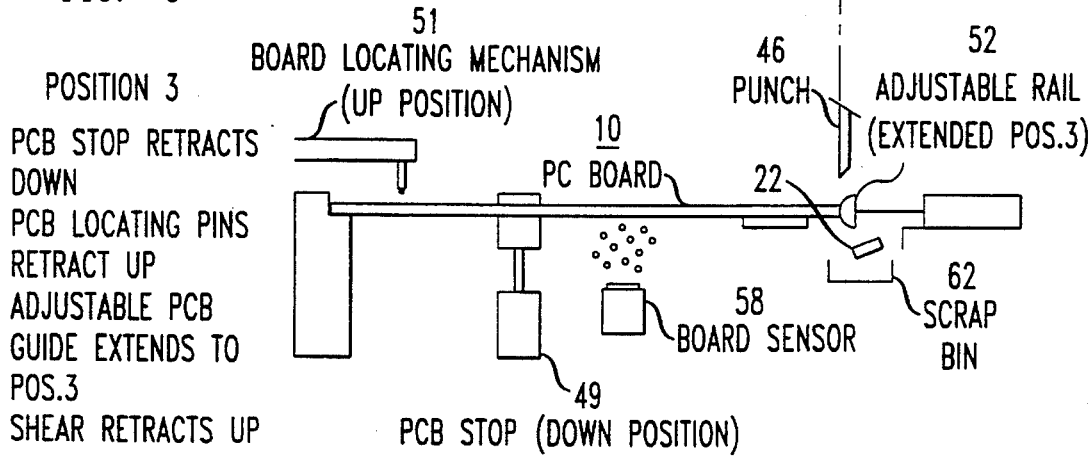

METHOD FOR SHEARING PANELS

TECHNICAL FIELD

This invention relates to a technique for shearing a panel, such as a circuit board or the like.

BACKGROUND ART

Many circuit boards carry a least one edge connector for connecting the board to an external system. During circuit board fabrication, the board is punched to create a cut-out in its edge for each connector. Typically, the edge connector cut-outs are only partially formed, leaving a thin web of material in what would otherwise be the opening ("throat") of each cut-out. Typically, these webs are integral with each other, effectively forming an elongated tab at the edge of the board. To fully form the edge connector cut-outs, the tab must be sheared, thereby removing the web from each cut-out While seemingly inefficient, there is a good reason for forming the edge connector cut-outs in this manner. While the webs remain in place, the edge of the board remains continuous. Consequently, the board may be handled more easily. Further, each cut-out that ultimately receives an edge connector isn't as likely to be damaged during board handling if the web remains in place until immediately before edge connector attachment.

Various equipment exists for shearing the tab on the board to remove the webs and thus fully form the edge connector cut-outs. Such equipment typically includes a shear that invariably lies at a height different from that of the board as the board exits an upstream fabrication station. Thus, the board must be raised or lowered and/or shuttled or rotated to match the height and/or orientation of the shear before the tab can be severed.

Thus, there is a need for a technique for shearing a circuit board that avoids the need to off-load and/or re-orient the board to the shear.

BRIEF SUMMARY OF THE INVENTION

Briefly, in accordance with the invention, a method is provided for shearing a panel, such as a circuit board, to remove a tab running along its edge. The method is initiated by transporting the panel into a shear that is in-line with the panel, thereby obviating the need raise or lower the panel to match the height of the shear. As the panel is transported into the shear, an adjustable guide rail within the shear is extended to a first position to engage the tab on the panel and guide the panel into the shear. After the panel has been transported into the shear, the panel is held stationary. The adjustable guide rail is retracted from the tab whereupon the tab is sheared from the panel. Once the tab has been sheared, then the adjustable guide is extended to a second position to engage the circuit board along the edge formed once the tab is sheared from the panel. Thereafter, the panel is transported from the shear while being guided by the adjustable guide rail.

BRIEF DESCRIPTION OF THE DRAWINGS

FIGS. 4, 5 and 6 are simplified side views of the shear system of FIG. 3 showing an adjustable guide rail of the system at a first extended position, a second retracted position, and a third extended position, respectively.

DETAILED DESCRIPTION

Figure 1:
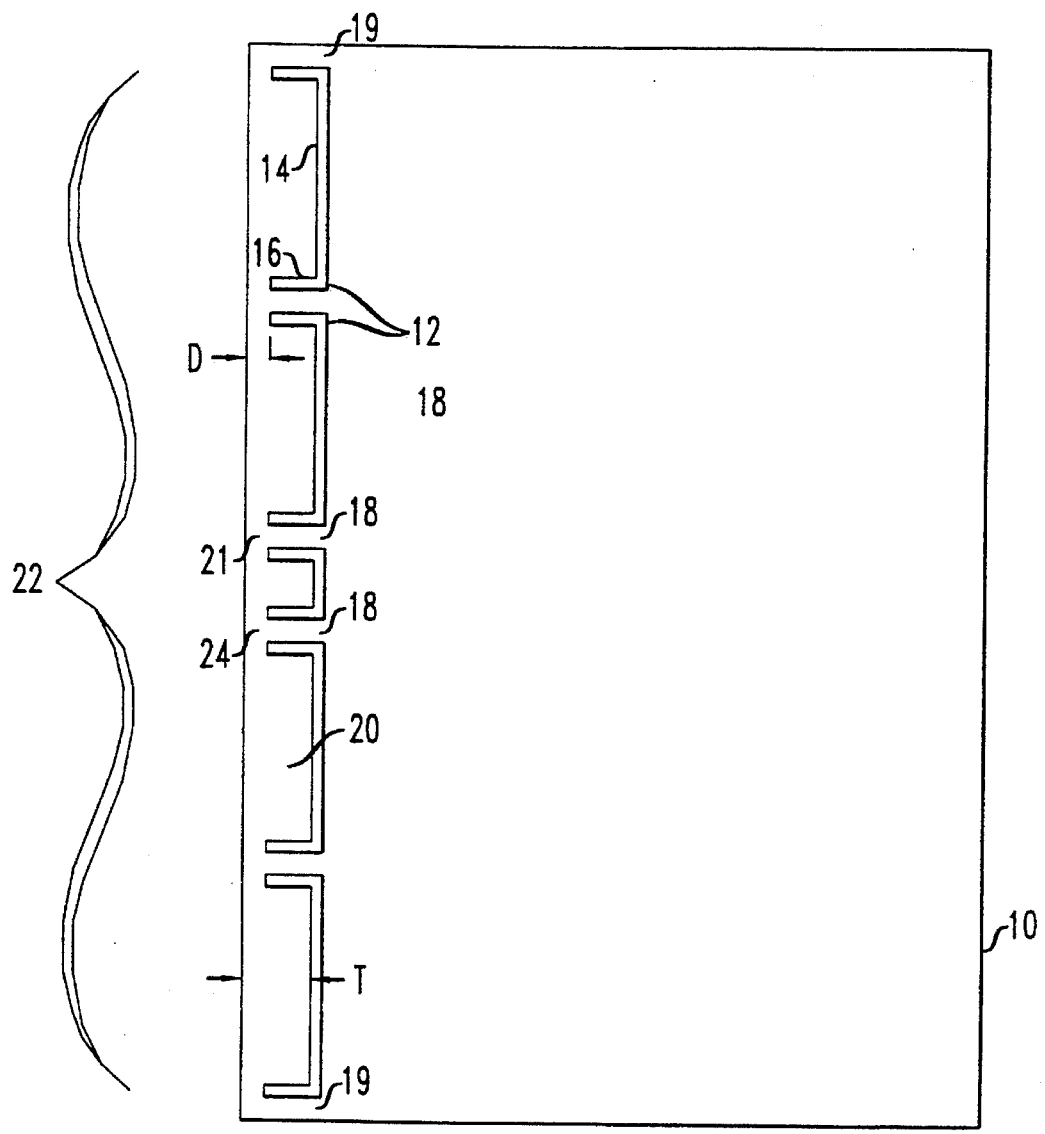
FIG. 1 is a plan view of a circuit board according to the prior art.

FIG. 1 depicts a prior art panel 10 which, in the illustrated embodiment, comprises a circuit board that carries one or more components (not shown). The circuit board 10 of FIG. 1 has a plurality of partially formed cut-outs 12—12, each comprised of a longitudinal open portion or channel 14 and a pair of lateral open channels 16—16. Each lateral channel 16 extends at a right angle from one of the ends of the longitudinal channel 14 and runs towards, but ends a short distance D from, the left-hand edge of the circuit board 10 as seen in FIG. 1. The longitudinal channel 14 of each cut-out is typically aligned with the longitudinal channel of the other cut-outs, whereas the lateral channels 16—16 of the cut-outs are parallel to each other. A narrow strip 18 separates each lateral channel 16 from a neighboring lateral channel while a narrow strip 19 separates one of the lateral channels 16 of each upper and lower cut-out 12 from the upper and lower edges, respectively, of the circuit board 10.

Lying to the left of the longitudinal channel 14 of each cut-out 12 is a web 20 having a width T corresponding to the throat of the cut-out. Each web 20 is joined to each adjacent web by an integral band 21. The combination of the webs 20—20 and bands 21—21 yield an elongated tab 22 that forms the left-hand edge of the circuit board 10. The tab 22 can be sheared from the circuit board 10 by applying a shearing force to the board along each of a plurality of score lines 24 (shown in phantom), each score line running across one of the strips 18 and 19 parallel to each longitudinal channel 14. Once the tab 22 is separated from the circuit board 10, each web 20 is thus removed from the throat of each cut-out 12, leaving the throat open to receive an edge connector (not shown). As may be appreciated, with the tab 22 removed, the left-hand edge of the circuit board 10 now lies coincident with the score lines 24—24, thus making the board narrower than before by the width D of the bands 21—21 of the now-removed tab.

Figure 2:
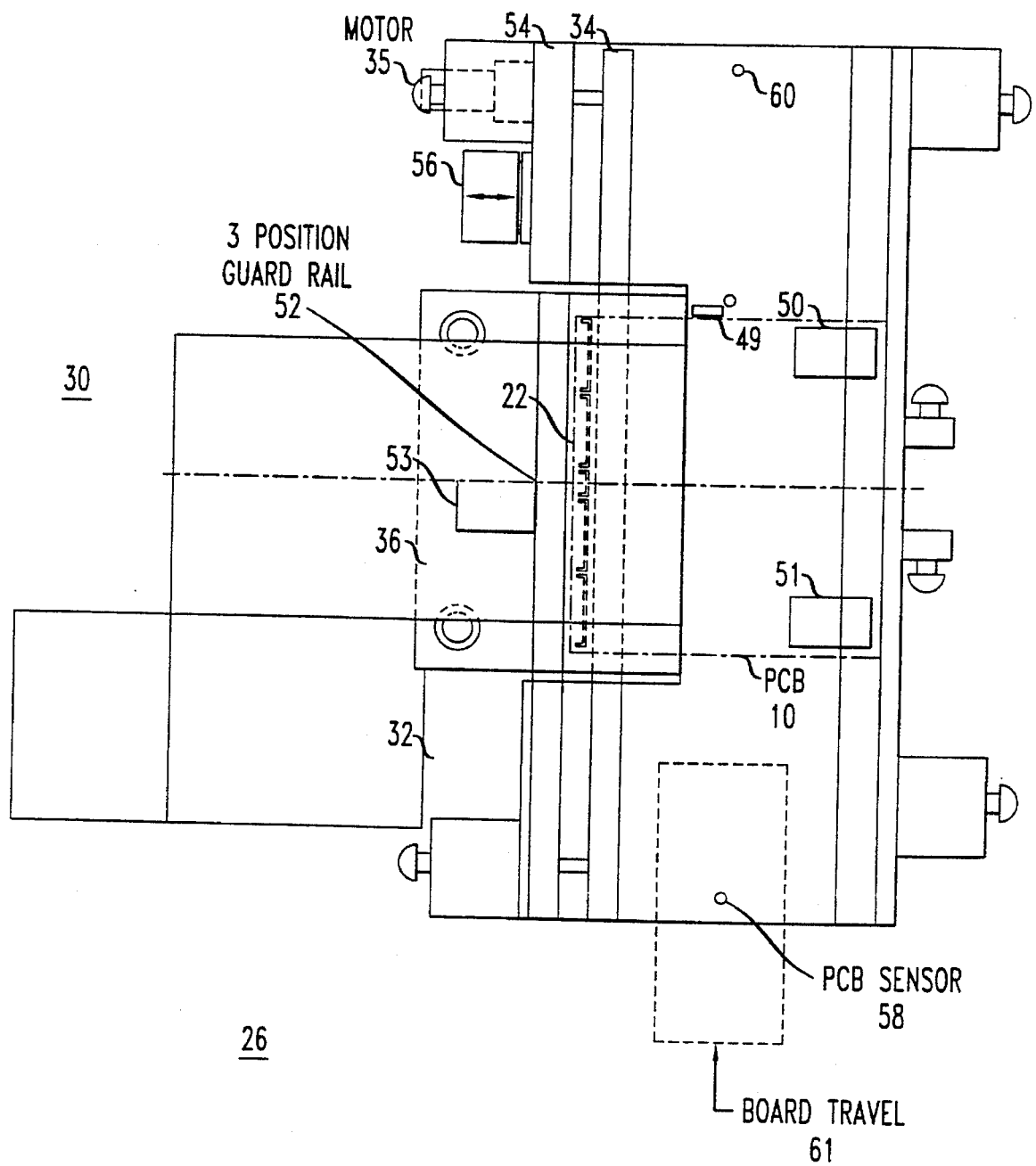
FIG. 2 is a plan view of a shear system in accordance with the invention.
Figure 3:
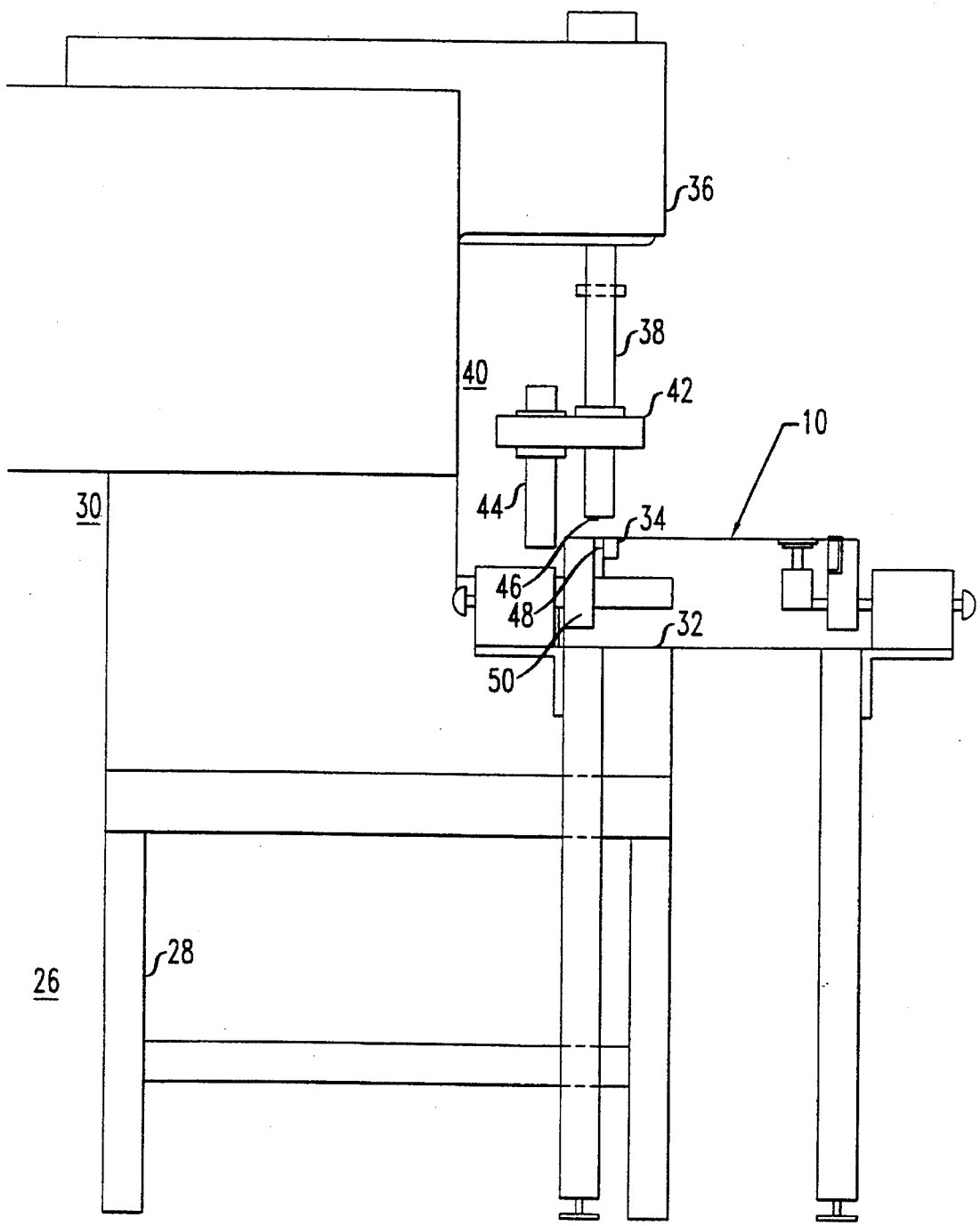
FIG. 3 is a side view of the shear system of FIG. 2.

FIGS. 2 and 3 show plan and sides views, respectively, of a shear system 26, in accordance with the invention, for shearing the tab 22 from the circuit board 10, both of FIG. 1. As seen in FIG. 3, the system 26 includes a frame 28 for supporting a shear 30 having a bed 32 that carries a conveyor 34 driven by a motor 35. The conveyor 34 lies in the same horizontal plane as a conveyor (not shown) that transports the circuit board 10 from an upstream fabrication station (not shown) to the shear 30. In this way, the conveyor 34 can transport the circuit board 10 from the upstream conveyor into the shear 30 without the need to raise or lower the board as was necessary with past circuit board shearing equipment.

The shear 30 includes a head 36, which, as best illustrated in FIG. 3, overlies a a portion of the conveyor 34. The head 36 of the shear 30 contains a mechanism (not shown), such as a hydraulic cylinder or the like, for vertically reciprocating a ram 38, best seen in FIG. 3, along an axis $C_L$ that lies slightly to the left (as seen in FIG. 3) of the left-hand edge of the conveyor 34. As the ram 38 is reciprocated, a collar 42, carried by the ram travels along a fixed, vertically rising post 44. In this way the ram 38 is constrained against lateral movement.

In practice, the conveyor 34 is slightly narrower than the circuit board 10 so that a portion of the circuit board overhangs the conveyor, and thus, underlies the ram 38 as the board is transported into the shear. When the circuit board 10 is loaded onto the conveyor 34, the board is oriented so the tab 22 (see FIG. 3) overhangs the conveyor so that tab can pass directly beneath the ram 38. Still referring to FIG. 3, the ram 38 carries a punch 46 at its lower end, adapted to contact the circuit board 10 along each of the score lines 24—24 of FIG. 1 when the tab 22 underlies the ram. The punch 46 mates with a die 48 supported by the shear bed 32 directly beneath the punch to underlie and support the overhanging tab 22 on the circuit board 10.

To assure that the circuit board 10 is not transported past the ram 38, an adjustable stop 49 is mounted in the shear bed 32. As will be discussed hereinafter, the stop 49 moves upwardly once the circuit board 10 enters the shear 30 to stop the board once the tab 22 of FIG. 1 directly underlies the ram 38 of FIG. 3. After the circuit board 10 has been sheared to separate the tab 22 of FIG. 1, the stop 49 retracts, permitting the board to be displaced by the conveyor away from the ram 38 (see FIG. 3).

In addition to the board stop 49, the shear 30 includes a pair of circuit board locating (clamping) mechanisms 50 and 51 located in spaced relationship long the right-hand edge of the conveyor as best seen in FIG. 2. Each of the locating mechanisms 50 and 51 releasably engages a tooling hole (not shown) in the circuit board 10 while the board is stopped by the adjustable stop 49 of FIG. 2. After the circuit board 10 has been sheared, the locating mechanisms 50 and 51 release the circuit board 10 so the board can be transported away from the shear 30.

The shear 36 includes a first elongated guide rail 52 rising upwardly from the shear bed 32 (see FIG. 3) to the left of, and parallel to, the conveyor 34. As will become better understood hereinafter from a discussion of FIGS. 4–6, the guide rail 52 is adjustable and is displaced by a motor 53 to each of three separate positions relative to the circuit board 10 for guiding the board during transit into and out of the shear 30.

Referring now to FIG. 2, the shear 30 further includes a second adjustable rail 54 rising upwardly from the shear bed 32 (see FIG. 3) parallel to, but downstream from, the rail 52 (assuming that the circuit board 10 travels on the conveyor 34 along a path designated by the arrow 55). A motor 56 displaces the adjustable rail 54 to and from the left-hand side of the conveyor 34 to one of two positions. At its first position, the adjustable rail 54 can engage the circuit board while the tab 22 is still present. In its second position, the rail 54 is positioned somewhat closer to the conveyor 34 than before to engage and guide the circuit board 10 after once the tab 22 has been sheared therefrom. Normally, the adjustable rail 54 remains extended at its second position, except for those instances when a circuit board 10 is to pass through the shear without having its tab 22 removed.

As best seen in FIG. 2, the shear 30 includes a pair of sensors 58 and 60 located in the shear bed 32 upstream and down stream of the ram 38. The sensor 58 indicates the presence of the circuit board 10 as it enters the shear 30 while the sensor 60 detects the board as it leaves the shear. The sensors 58 and 60 are connected to a control system (not shown), such as a conventional programmable logic controller that actuates the stop 49 and the board locating mechanisms 50 and 51, as well as the motors 53 and 56 in accordance with the position of the circuit board 10, as sensed by the sensors.

The overall operation of the shear system 26 may best be understood by reference to FIGS. 4–6. Referring to FIG. 4, at the outset, the adjustable rail 52 is positioned at its first extended position (position #2) at which the rail will contact the tab 22. Next, the conveyor 34 transports the circuit board 10 into the shear 30 (see FIGS. 2 and 3) during which time, the adjustable rail 52 engages the tab 22 to guide the circuit board 10. As the circuit board 10 travels into the shear 30, the board passes the sensor 58. When the sensor 58 has sensed the circuit board 10, the stop 49 extends itself, thereby stopping the board once the tab 22 underlies the punch 46 carried by the ram 38 (see FIGS. 2 and 3).

Referring to FIG. 5, after the circuit board 10 engages the now-raised stop 49, the board locating mechanisms 50 and 51 (only the mechanism 50 being shown in FIG. 5) are actuated to clamp the board. Thereafter, the motor 53 (see FIG. 2) displaces the adjustable rail 52 away from the tab 22 to a retracted position (position #1 in FIG. 5) at which the rail will not interfere with the tab. Once the rail 52 is retracted, then the ram 38 of FIG. 3 descends, driving the punch 46 against the tab 22, thereby shearing the tab from the board. In practice, the punch 46 travel downward a distance equal to about sixty-percent of the thickness of the board to shear the tab 22 after the punch initially contacts the board.

Referring to FIG. 6, after the punch 46 shears the tab 22, causing the tab to drop into a scrap bin 62, then the punch 46 retracts. Now, the stop 49 descends. Also, the board locating mechanisms 50 and 51 (only mechanism 51 shown in FIG. 6) release the circuit board 10 at this time. In addition, the adjustable rail 52 is now extended from its retracted position (position #1 in FIG. 5) to a second extended position (position #3 in FIG. 6) to contact the circuit board 10 along the edge created following removal of the tab 22. As discussed previously, when the tab 22 is sheared from the circuit board 10, the board now becomes narrower. Thus, to engage and guide the now narrower circuit board 10, the adjustable rail 52 moves leftward (as seen in FIG. 6) a distance approximately equal to the width of the tab 22 at its narrowest point. By adjusting the position of the adjustable rail 52 in this manner, the rail will always engage and guide the circuit board 10 to maintain the orientation of the board fairly constant before and after shearing, thereby facilitating an in-line shearing operation.

The foregoing describes a technique for shearing a tab 22 from a panel, such as a circuit board 10.

It is to be understood that the above-described embodiments are merely illustrative of the principles of the invention. Various modifications and changes may be made thereto by those skilled in the art which will embody the principles of the invention and fall within the spirit and scope thereof.

What is claimed is:

1. A method for shearing an outwardly extending tab, running along, and integral with, an edge of a panel, comprising the steps of:

transporting the panel along a conveyor into a shear in line with the panel while extending an adjustable guide rail on the shear to a first extended position to engage the tab on the panel to guide the panel into the shear;

holding the panel stationary after it has been transported into the shear;

retracting the adjustable guide rail away from the tab after the panel has been held stationary;

shearing the tab from the panel;

extending the adjustable guide rail on the shear to a second extended position to engage the panel at a cut edge that has been integral with the tab; and releasing the panel to permit it to be transported by the conveyor away from the shear while the panel is guided by the adjustable guide rail.

2. The method according to claim 1 wherein the panel is guided by a second adjustable guide rail away from the shear.

3. The method according to claim 1 wherein the panel is held stationary by the steps of:

raising an extendible stop once the panel is transported into the shear to stop the panel so that the tab is aligned with the shear; and releasably engaging an edge of the panel opposite the tab once the panel has been stopped by the extendible stop.

4. The method according to claim 3 including the step of sensing the panel upon transport into the shear and wherein the stop is raised and the edge of the panel is releasably engaged in response to the sensing of the panel.

5. The method according to claim 3 wherein the step of releasing the panel includes the steps of:

lowering the stop; and disengaging the edge of the panel.

6. The method according to claim 5 further including the step of sensing the panel as it leaves the shear.

\* \* \* \* \*